(12) United States Patent
Carlson et al.

(10) Patent No.: US 7,516,248 B2
(45) Date of Patent: Apr. 7, 2009

(54) OBTAINING EXTENDED QUEUE MEASUREMENT DATA FOR A RANGE OF LOGICAL CONTROL UNIT QUEUES

(75) Inventors: Scott M. Carlson, Tucson, AZ (US); Greg A. Dyck, Morgan Hill, CA (US); Tan Lu, Poughkeepsie, NY (US); Kenneth J. Oakes, Wappingers Falls, NY (US); Dale F. Riedy, Jr., Poughkeepsie, NY (US); William J. Rooney, Hopewell Junction, NY (US); John S. Trotter, Pleasant Valley, NY (US); Leslie W. Wyman, Poughkeepsie, NY (US); Harry M. Yudenfriend, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/965,916

(22) Filed: Dec. 28, 2007

(65) Prior Publication Data

US 2008/0109580 A1    May 8, 2008

Related U.S. Application Data

(60) Continuation of application No. 11/282,393, filed on Nov. 18, 2005, now Pat. No. 7,373,435, which is a division of application No. 10/435,906, filed on May 12, 2003, now Pat. No. 7,000,036.

(51) Int. Cl.
*G06F 3/00* (2006.01)
*G01R 15/00* (2006.01)

(52) U.S. Cl. .................... 710/15; 710/20; 710/58; 702/57

(58) Field of Classification Search ............ None
See application file for complete search history.

(56) References Cited

U.S. PATENT DOCUMENTS

| 3,693,161 | A | 9/1972 | Price et al. |
| 4,080,649 | A | 3/1978 | Calle et al. |
| 4,207,609 | A | 6/1980 | Luiz et al. |
| 4,564,903 | A | 1/1986 | Guyette et al. |
| 4,843,541 | A | 6/1989 | Bean et al. |
| 5,170,472 | A | 12/1992 | Cwiakala et al. |
| 5,185,736 | A | 2/1993 | Tyrrell et al. |
| 5,297,262 | A | 3/1994 | Cox et al. |
| 5,317,739 | A | 5/1994 | Elko et al. |
| 5,414,851 | A | 5/1995 | Brice, Jr. et al. |

(Continued)

OTHER PUBLICATIONS

System Overview of the SGI Origin 200/2000 Product Line, 1997, IEEE Publication pp. 150-156.

(Continued)

*Primary Examiner*—Alan S. Chen
(74) *Attorney, Agent, or Firm*—John E. Campbell

(57) ABSTRACT

I/O measurement data for channels attached to logical control unit queues is obtained related to a plurality of logical control unit queues. A store secondary queue measurement data instruction specifies a range of queues for which extended secondary measurement blocks derived from the I/O measurement data are stored at a memory address specified by the store secondary queue measurement data instruction.

25 Claims, 8 Drawing Sheets

U.S. PATENT DOCUMENTS

| | | |
|---|---|---|
| 5,452,455 A | 9/1995 | Brown et al. |
| 5,526,484 A | 6/1996 | Casper et al. |
| 5,537,574 A | 7/1996 | Elko et al. |
| 5,548,791 A | 8/1996 | Casper et al. |
| 5,564,040 A | 10/1996 | Kubala |
| 5,568,648 A | 10/1996 | Coscarella et al. |
| 5,600,805 A | 2/1997 | Fredericks et al. |
| 5,640,603 A | 6/1997 | Meritt et al. |
| 5,644,712 A | 7/1997 | Coscarella et al. |
| 5,680,580 A | 10/1997 | Beardsley et al. |
| 5,793,983 A | 8/1998 | Albert et al. |
| 5,845,146 A | 12/1998 | Onodera et al. |
| 5,907,684 A | 5/1999 | Halma et al. |
| 5,996,026 A | 11/1999 | Onodera et al. |
| 6,125,411 A | 9/2000 | Sato |
| 6,195,330 B1 | 2/2001 | Sawey et al. |
| 6,249,787 B1 | 6/2001 | Schlelmer et al. |
| 6,751,683 B1 | 6/2004 | Johnson et al. |
| 6,769,009 B1 | 7/2004 | Reisman |
| 6,950,888 B1 | 9/2005 | Rooney et al. |
| 7,085,860 B2 | 8/2006 | Dugan et al. |
| 7,174,274 B2 | 2/2007 | Carlson et al. |
| 2003/0103504 A1 | 6/2003 | Dugan et al. |
| 2003/0187627 A1 | 10/2003 | Hild et al. |

OTHER PUBLICATIONS z/Series—Input/Output Configuration Program user's Guidew for IYPIOCP, SB10-7029-03. International Business Machines Corporation, 4th Edition, Aug. 2002.

z/Architecture—Principles of Operation SA 22-7832-01 International Business Machines Corporation, 2nd Edition, Oct. 2001.

| B | R | QUEUE COUNT |
|---|---|---|
| | | QUEUE NUMBER |
| | | SUMMATION OF QUEUE COUNTS |
| | | SUMMATION OF ENQUEUES |
| | | SUMMATION OF CHANNEL WAIT TIME |
| | | SWITCH BUSY COUNT 0 |
| | | CONTROL UNIT BUSY COUNT 0 |
| | | SUCCESS COUNT 0 |
| | | CONTROL UNIT BUSY TIME 0 |
| | | INITIAL COMMAND RESPONSE TIME 0 |
| | | SWITCH BUSY COUNT SUMMATION 0 |
| | | |
| | | SWITCH BUSY COUNT 1 |
| | | ⋮ |
| | | SWITCH BUSY COUNT 7 |
| | | CONTROL UNIT BUSY COUNT 7 |
| | | SUCCESS COUNT 7 |
| | | CONTROL UNIT BUSY TIME 7 |
| | | INITIAL COMMAND RESPONSE TIME 7 |
| | | SWITCH BUSY COUNT SUMMATION 7 |

*fig. 3*

OBTAINING EXTENDED QUEUE MEASUREMENT DATA FOR A RANGE OF LOGICAL CONTROL UNIT QUEUES

CROSS-REFERENCE TO RELATED APPLICATIONS

This application is a continuation of U.S. patent application Ser. No. 11/282,393 "EXTENDED INPUT/OUTPUT MEASUREMENT BLOCK" filed Nov. 18, 2005, now U.S. Pat. No. 7,373,435, which is a division of Ser. No. 10/435,906 "EXTENDED INPUT/OUTPUT MEASUREMENT FACILITIES" filed May 12, 2003, now U.S. Pat. No. 7,000,036 and assigned to IBM. The disclosure of the foregoing applications are incorporated herein by reference.

TECHNICAL FIELD

This invention relates, in general, to performance monitoring, and in particular, to input/output (I/O) measurement facilities used in performance monitoring.

BACKGROUND OF THE INVENTION

Monitoring the performance of a computing environment includes analyzing measurement data collected for that environment. The measurement data that is collected is used for accounting, capacity planning and/or to determine where improvements are to be made so that system performance can be enhanced.

One subsystem of a computing environment for which data is collected is the I/O subsystem. In one example, an I/O measurement facility, such as the Resource Management Facility (RMF) offered by International Business Machines Corporation, Armonk, N.Y., is used to accumulate data for the I/O subsystem. The data that is collected is associated with various components of the I/O subsystem, such as subchannels which represent I/O devices, and is stored in measurement blocks for access by programs. The measurement blocks are stored in contiguous memory and thus, a particular block is accessed by a measurement block origin and index. The data stored in the existing measurement blocks is an accumulation of data over a period of time for multiple I/O operations. In order to determine the measurement data for a particular I/O operation, the operating system needs to calculate the information for that I/O operation by subtracting the counters copied from the measurement block before the I/O operation is started from the values in the measurement blocks after the I/O operation while also dealing with cases where the counters wrap.

With the ever increasing size of the I/O subsystem, the contiguous storage of the blocks is becoming cumbersome. Further, the measurement blocks are cumbersome because the operating system cannot dynamically grow the contiguous real storage when the system is up and running and additional devices are dynamically added. Moreover, the existing blocks are inadequate for the information that is desired. Yet further, the time it takes for a program to calculate the information for a particular I/O operation is increasing and such calculations lead to inaccuracies because of the insufficient granularity.

A subchannel provides the logical appearance of a device to the program and contains the information required for sustaining a single I/O operation. The subchannel consists of internal storage that contains information in the form of a CCW address, channel-path identifier, device number, count, status indications, and I/O-interruption subclass code, as well as information on path availability and functions pending or being performed. I/O operations are initiated with a device by executing I/O instructions that designate the subchannel associated with the device.

Each device is accessible by means of one subchannel per channel subsystem to which it is assigned during installation. The device may be a physically identifiable unit or may be housed internal to a control unit. For example, in certain disk-storage devices, each actuator used in retrieving data is considered to be a device. In all cases, a device, from the point of view of the channel subsystem, is an entity that is uniquely associated with one subchannel and that responds to selection by the channel subsystem by using the communication protocols defined for the type of channel path by which it is accessible.

In some models, subchannels are provided in blocks. In these models, more subchannels may be provided than there are attached devices. Subchannels that are provided but do not have devices assigned to them are not used by the channel subsystem to perform any function and are indicated by storing the associated device number-valid bit as zero in the subchannel information block of the subchannel.

The number of subchannels provided by the channel subsystem is independent of the number of channel paths to the associated devices. For example, a device accessible through alternate channel paths still is represented by a single subchannel. Each subchannel is addressed by using a 16-bit binary subchannel number.

After I/O processing at the subchannel has been requested by executing START SUBCHANNEL, the CPU is released for other work, and the channel subsystem assembles or disassembles data and synchronizes the transfer of data bytes between the I/O device and main storage. To accomplish this, the channel subsystem maintains and updates an address and a count that describe the destination or source of data in main storage. Similarly, when an I/O device provides signals that should be brought to the attention of the program, the channel subsystem transforms the signals into status information and stores the information in the subchannel, where it can be retrieved by the Program.

Resume Subchannel (RSCH):

The channel subsystem is signaled to perform the resume function at the designated subchannel.

General register 1 contains the subsystem identification word, which designates the subchannel at which the resume function is to be Performed. The subchannel is made resume-pending.

Logically prior to the setting of condition code 0 and only if the subchannel is currently in the suspended state, path-not-operational conditions at the subchannel, if any, are cleared.

The channel subsystem is signaled to asynchronously perform the resume function.

Subsequent to the execution of RESUME SUBCHANNEL, the channel subsystem asynchronously performs the resume function. Except when the subchannel is subchannel-active, if the execution of RESUME SUBCHANNEL results in the setting of condition code 0, performance of the resume function causes execution of a currently suspended channel program to be resumed with the associated device, provided that the suspend flag for the current CCW has been set to zero by the program. If the suspend flag remains set to one, execution of the channel program remains suspended. But, if the subchannel is subchannel active at the time the execution of RESUME SUBCHANNEL results in the setting of condition code 0, then it is unpredictable whether execution of the current program is resumed or whether it is found by the resume function that the subchannel has become suspended in the interim. The subchannel is found to be suspended by the resume function only if the subchannel is status-pending with intermediate status when the resume-pending condition is recognized by the channel subsystem.

Start Subchannel (SSCH):

The channel subsystem is signaled to synchronously perform the start function for the associated device, and the execution parameters that are contained in the designated ORB are placed at the designated subchannel.

General register 1 contains the subsystem identification word, which designates the subchannel that is to be started. The second-operand address is the logical address of the ORB and is designated on a word boundary.

The execution parameters contained in the ORB are placed at the subchannel.

When START SUBCHANNEL is executed and the subchannel is status-pending with only secondary status and the extended-status-word format bit (L bit) is zero, the status-pending condition is discarded at the subchannel.

The subchannel is made start-pending, and the start function is indicated at the subchannel.

Logically prior to the setting of condition code 0, path-not-operational conditions at the subchannel, if any, are cleared.

The channel subsystem is signaled to asynchronously perform the start function.

Condition code 0 is set to indicate that the actions described above have been taken.

Associated Functions

Subsequent to the execution of START SUBCHANNEL, the channel subsystem asynchronously performs the start function.

The contents of the ORB, other than the fields that must contain all zeros, are checked for validity. In some models, the fields of the ORB that must contain zeros are also checked asynchronously (rather than during the execution of the instruction). When invalid fields are detected asynchronously, the subchannel becomes status-pending with primary, secondary, and alert status and with deferred condition code 1 and program check indicated. In this situation, the I/O operation or chain of I/O operations is not initiated at the device, and the condition is indicated by the start-pending bit being stored as one when the SCSW is cleared by the execution of TEST SUBCHANNEL.

In some models, path availability is tested asynchronously (rather than as part of the execution of the instruction). When no channel path is available for selection, the subchannel becomes status-pending with primary and secondary status and with deferred condition code 3 indicated. The I/O operation or chain of I/O operations is not initiated at the device, and this condition is indicated by the start-pending bit being stored as one when the SCSW is cleared by the execution of TEST SUBCHANNEL.

If conditions allow, a channel path is chosen and execution of the channel program that is designated in the ORB is initiated.

Start Function and Resume Function

Subsequent to execution of START SUBCHANNEL and RESUME SUBCHANNEL, the channel subsystem performs the start and resume functions, respectively, to initiate an I/O operation with the associated device. Performance of a start or resume function consists of: (1) executing a path-management operation, (2) executing an I/O operation or chain of I/O operations with the associated device, and (3) causing the sub-channel to be made status-pending, indicating completion of the start function. The start function initiates the execution of a channel program that is designated in the ORB, which in turn is designated as the operand of START SUBCHANNEL, in contrast to the resume function which initiates the execution of a suspended channel program, if any, beginning at the CCW that caused suspension; otherwise, the resume function is performed as if it were a start function.

Start-Function and Resume-Function Path Management

A path-management operation is executed by the channel subsystem during the performance of either a start or resume function to choose an available channel path that can be used for device selection to initiate an I/O operation with that device. The actions taken are as follows:

1. If the subchannel is currently start-pending and device-active, the start function remains pending at the subchannel until the secondary status for the previous start function has been accepted from the associated device and the subchannel is made start-pending alone. When the status is accepted and it does not describe an alert interruption condition, the subchannel is not made status-pending, and the performance of the pending start function is subsequently initiated. If the status describes an alert interruption condition, the subchannel becomes status-pending with secondary and alert status, the pending start function is not initiated, deferred condition code 1 is set, and the start-pending bit remains one. If the subchannel is currently start-pending alone, the performance of the start function is initiated as described below.

2. If a dedicated allegiance exists at the subchannel for a channel path, the channel subsystem chooses that path for device selection. If a busy condition is encountered while attempting to select the device and a dedicated allegiance exists at the subchannel, the start function remains pending until the internal indication of busy is reset for that channel path. When the internal indication of busy is reset, the performance of the pending start function is initiated on that channel path.

3. If no channel paths are available for selection and no dedicated allegiance exists in the subchannel for a channel path, a channel path is not chosen.

4. If all channel paths that are available for selection have been tried and one or more of them are being used to actively communicate with other devices, or, alternatively, if the channel subsystem has encountered either a control-unit-busy or device-busy condition on one or more of those channel paths, or a combination of those conditions on one or more of those channel paths, the start function remains pending at the subchannel until a channel path, control unit, or device, as appropriate, becomes available.

5. If (1) the start function is to be initiated on a channel path with a device attached to a type-1 control unit and (2) no other device is attached to the same control unit whose subchannel has either a dedicated allegiance to the same channel path or a working allegiance to the same channel path where primary status has not been received for that subchannel, then that channel path is chosen if it is available for selection; otherwise, that channel path is not chosen. If, however, another channel path to the device is available for selection and if no allegiances exist as described above, that channel path is chosen. If no other channel paths are available for selection, the start or resume function, as appropriate, remains pending until a channel path becomes available.

6. If the device is attached to a type-3 control unit and if at least one other device is attached to the same control unit whose subchannel has a dedicated allegiance to the same channel path, another channel path that is available for selection may be chosen, or the start function remains pending until the dedicated allegiance for the other device is cleared.

7. If a channel path has been chosen and a busy indication is received during device selection to initiate execution of the first command of a pending channel program, the channel path over which the busy indication is received is not used again for that device or control unit (depending on the device-busy or control-unit-busy indication received) until the internal indication of busy is reset.

8. If, during an attempt to select the device in order to initiate execution of the first command specified for the start or implied for the resume function, the channel subsystem receives a busy indication, it performs one of the following actions:

a. If the device is specified to be operating in multipath mode and the busy indication received is device busy, then the start or resume function remains pending until the internal indication of busy is reset.

b. If the device is specified to be operating in multipath mode and the busy indication received is control unit busy, or if the device is specified to be operating in single-path mode, the channel subsystem attempts selection of the device by choosing an alternate channel path that is available for selection and continues the path-management operation until either the start or resume function is initiated or selection of the device has been attempted on all channel paths that are available for selection. If the start or resume function has not been initiated by the channel subsystem after all channel paths available for selection have been chosen, the start or resume function remains pending until the internal indication of busy is reset.

c. If the subchannel has a dedicated allegiance, then action 2 applies.

9. When, during the selection attempt to transfer the first command, the device appears not operational and the corresponding channel path is operational for the subchannel, a path-not-operational condition is recognized, and the state of the channel path changes at the subchannel from operational for the subchannel to not operational for the subchannel. The path-not-operational conditions at the subchannel, if any, are preserved until the subchannel next becomes clear pending, start-pending, or resume-pending (if the subchannel was suspended), at which time the path-not-operational conditions are cleared. If, however, the corresponding channel path is not operational for the subchannel, a path-not-operational condition is not recognized. When the device appears not operational during the selection attempt to transfer the first command on a channel path that is available for selection, one of the following actions occurs:

a. If a dedicated allegiance exists for that channel path, then it is the only channel path that is available for selection; therefore, further attempts to initiate the start or resume function are abandoned, and an interruption condition is recognized.

b. If no dedicated allegiance exists and there are alternate channel paths available for selection which have not been tried, one of those channel paths is chosen to attempt device selection and transfer the first command.

c. If no dedicated allegiance exists, no alternate channel paths are available for selection which have not been tried, and the device has appeared operational on at least one of the channel paths that were tried, the start or resume function remains pending at the subchannel until either a channel path, a control unit, or the device, as appropriate, becomes available.

d. If no dedicated allegiance exists, no alternate channel paths are available for 1 selection which have not been tried, and the device has appeared not operational on all channel paths that were tried, further attempts to initiate the start or resume function are abandoned, and an interruption condition is recognized.

10. When the subchannel is active and an I/O operation is to be initiated with a device, all device selections occur according to the LPUM indication if the multipath mode is not specified at the subchannel. For example, if command chaining is specified, the channel subsystem transfers the first and all subsequent commands describing a chain of I/O operations over the same channel path.

Measurement-Block Update

The measurement-block-update facility provides the program with the capability of accumulating performance information for subchannels that are enabled for the measurement-block-update mode when the measurement-block-update mode is active. A subchannel is enabled for measurement-block-update mode by setting bit 11 of word 1 of the SCHIB operand to one and then executing MODIFY SUBCHANNEL. The measurement-block-update mode is made active by executing SET CHANNEL MONITOR when bit 62 of general register 1 is one.

When the measurement-block-update mode is active and the subchannel is enabled for the measurement-block-update mode, information is accumulated in a measurement block associated with the subchannel. A measurement block is a 32-byte area in main storage that is associated with a subchannel for the purpose of accumulating measurement data. The program specifies a contiguous area of absolute storage, referred to as the measurement-block area, and subdivides this area into 32-byte blocks, one block for each subchannel for which measurement data is to be Accumulated. The measurement-block-update facility uses the measurement-block index contained at the subchannel in conjunction with the measurement-block origin established by the execution of SET CHANNEL MONITOR to compute the absolute address of the measurement block associated with a subchannel.

Measurement data is stored in the measurement block associated with the subchannel each time an I/O operation or chain of I/O operations initiated by START SUBCHANNEL is suspended or completed. The completion of an I/O operation or chain of I/O operations is normally signaled by the primary interruption condition. Seven fields are defined in the measurement block in which measurement data is accumulated by the measurement-block-update facility: SSCH+RSCH count, sample count, device-connect time, function-pending time, device-disconnect time, control-unit-queuing, and device-active-only time.

Measurement Block The measurement block is a 32-byte area at the location designated by the program, using the measurement-block origin in conjunction with the measurement-block index. 1The measurement block contains the accumulated values of the measurement data described below. When the measurement-block-update mode is active and the subchannel is enabled for measurement-block update, the measurement-block-update facility accumulates the values for the measurement data that accrue during the execution of an I/O operation or chain of I/O operations initiated by START SUBCHANNEL.

When the I/O operation or chain of I/O operations is suspended or completed and no error condition is encountered, the accrued values are added to the accumulated values in the measurement block for that subchannel. If an error condition is detected and subchannel-logout information is stored in the extended-status word (ESW), the accrued values are not added to the accumulated values in the measurement block for the subchannel, and the two count fields are not incremented.

If any of the accrued time values is detected to exceed the internal storage provided for accruing these values, or the control unit cannot provide an accurate queuing time or defer time for the current operation, or the channel subsystem successfully recovers from certain error conditions, none of the accrued values are added to the measurement block for the subchannel, the sample count is not incremented, but the SSCH+RSCH count is incremented.

Accesses to the measurement block by the measurement-block-update facility, in order to accumulate measurement data at the suspension 1or completion of an I/O function, appear block concurrent to CPUs. CPU accesses to the block, either fetches or stores, are inhibited during the time the measurement-block update is being performed by the measurement-block-update facility.

SSCH+RSCH Count: Bits 0-15 of word 0 are used as a binary counter. During the performance of a start function for which measurement-block update is active, when (1) the primary or secondary interruption condition, as appropriate, is recognized or (2) the suspend function is performed, the counter is incremented by adding one in bit position 15, and the measurement data is stored. The counter wraps around from the maximum value of 65,535 to 0. The program is not alerted when counter overflow occurs.

If the measurement-block-update mode is active and the subchannel is enabled for measuring, the SSCH+RSCH count is incremented even when the lack of measured values for an individual start function precludes the updating of the remaining fields of the measurement block or when the timing-facility bit for the subchannel is zero. The SSCH+RSCH count is not incremented if the measurement-block-update mode is inactive, if the subchannel is not enabled for the measurement block update, or if subchannel-logout information has been generated for the start function.

Sample Count: Bits 16-31 of word 0 are used as a binary counter. When the time-accumulation fields following word 0 of the measurement block are updated, the counter is incremented by adding one in bit position 31. On some models, certain conditions may preclude the measurement-block-update facility obtaining the accrued values of the measurement data for an individual start function, even when the measurement-block-update mode is active and the subchannel is enabled for that mode. The control unit may also signal that it was not able to accumulate an accurate queuing time. In these situations, the sample-count field is not incremented.

The counter wraps around from the maximum value of 65,535 to 0. The program is not alerted when counter overflow occurs. This field is not updated if the channel-subsystem-timing facility is not provided for the subchannel.

The System Library publication for the system model specifies the conditions, if any, that preclude the updating of the sample count and time accumulation fields of the measurement block.

Device-Connect Time: Bits 0-31 of word 1 contain the accumulation of measured device connect-time intervals. The device-connect-time interval (DCTI) is the sum of the time intervals measured whenever the device is logically connected to a channel path while the subchannel is subchannel active and the device is actively communicating with the channel path. The device connect time does not include the intervals when a device is logically connected to a channel path but is not actively communicating with the channel. The device reports the accumulation of time intervals when the device is logically connected but not actively communicating with the channel path as control-unit-defer time. The control-unit-defer time is not included in the device-connect-time measurement but, rather, is added to the accrued device-disconnect-time measurement for the operation.

The time intervals are measured using a resolution of 128 microseconds. The accumulated value is modulo approximately 152.71 hours, and the program is not alerted when an overflow occurs. This field is not updated if (1) the channel-subsystem-timing facility is not provided for the subchannel, (2) the measurement-block-update mode is inactive, or (3) any of the time values accrued for the current start function has been detected to exceed the internal storage in which it was accrued.

Accumulation of device-connect-time intervals for a subchannel and storing this data in the ESW are not affected by whether the measurement-block-update mode is active.

Function-Pending Time: Bits 0-31 of word 2 contain the accumulated SSCH- and RSCH-function-pending time. Function-pending time is the time interval between acceptance of the start function (or resume function if the subchannel is in the suspended state) at the subchannel and acceptance of the first command associated with the initiation or resumption of channel-program execution at the device.

When channel-program execution is suspended because of a suspend flag in the first CCW of a channel program, the suspension occurs prior to transferring the first command to the device. In this case, the function-pending time accumulated up to that point is added to the value in the function-pending-time field of the measurement block. Function-pending time is not accrued while the subchannel is suspended. Function-pending time begins to be accrued again, in this case, when RESUME SUBCHANNEL is subsequently executed while the designated subchannel is in the suspended state.

The function-pending-time interval is measured using a resolution of 128 microseconds. The accumulated value is modulo approximately 152.71 hours, and the program is not alerted when an overflow occurs. This field is not updated if the channel-subsystem-timing facility is not provided for the subchannel.

Device-Disconnect Time: Bits 0-31 of word 3 contain the accumulated device-disconnect time. Device-disconnect time is the sum of the time intervals measured whenever the device is logically disconnected from the channel subsystem while the subchannel is subchannel-active. The device-disconnect time also includes the sum of control-unit-defer-time intervals reported by the device during the I/O operation.

Device-disconnect time is not accrued while the subchannel is in the suspended state. Device-disconnect time begins to be accrued again, in this case, on the first device disconnection after channel-program execution has been resumed at the device (the subchannel is again subchannel active).

The device-disconnect-time interval is measured by using a resolution of 128 microseconds. The accumulated value is modulo approximately 152.71 hours; the program is not alerted when an overflow occurs. This field is not updated if the channel-subsystem-timing facility is not provided for the subchannel.

The device-disconnect time does not include the interval between the primary status condition and the secondary status condition at the end of an I/O operation when the subchannel is no longer subchannel-active, but the I/O device is active. If the channel subsystem provides the device-active only measurement facility, this time is accumulated into the device-active-only time field of the measurement block.

Control-Unit-Queuing Time: Bits 0-31 of word 4 contain the accumulated control-unit-queuing time. Control-unit-queuing time is the sum of the time intervals measured by the control unit whenever the device is logically disconnected from the channel subsystem during an I/O operation while the device is busy with an operation initiated from a different system.

Control-unit-queuing time is not accrued while the subchannel is in the suspended state. Control-unit-queuing time may be accrued for the channel program after the subchannel becomes subchannel-active following a successful Resumption.

The control-unit-queuing-time field is updated such that bit 31 represents 128 microseconds. The accumulated value is modulo approximately 152.71 hours; the program is not alerted when an overflow occurs. This field is not updated if the channel-subsystem-timing facility is not provided for the subchannel, or if the control unit does not provide a queuing time.

Device-active-only time: Bits 0-31 of word 5 contain the accumulated device-active-only time. Device-active-only time is the sum of the time intervals when the subchannel is device-active but not subchannel-active at the end of an I/O operation or chain of I/O operations initiated by a start function or resume function.

Device-active-only time is not accumulated when the subchannel is device-active during periods that the subchannel is active; such time is accumulated as device-connect time or device-disconnect time as appropriate.

The device-active-only-time field is updated such that bit 31 represents 128 microseconds. The accumulated value is modulo approximately 152.71 hours; the program is not alerted when an overflow occurs. This field is not updated if the channel-subsystem-timing facility is not provided for the subchannel.

Control-Unit-Defer Time: Control-unit-defer time is the sum of the time intervals measured by the control unit whenever the device is logically connected to the channel subsystem during an I/O operation but is not actively communicating with the channel because of device-dependent delays in channel program execution. The control-unit-defer-time is not stored in the measurement block as a separate measurement field but is used in the calculation of device-connect-time measurement and device-disconnect-time measurement for an operation.

Control-unit-defer time, if supported by a control unit, is accrued while the device is logically connected to the channel. The time is reported to the channel when channel-end status is presented that causes a device disconnection or terminates the I/O operation. Control-unit-defer time is subtracted from the device-connect-time measurement and is added to the device-disconnect-time measurement reported for the operation.

Reserved: The remaining words of the measurement block, along with any words associated with facilities that are not provided by the channel subsystem or the subchannel, are reserved for future use. They are not updated by the measurement-block-update facility.

Measurement-Block Origin: The measurement-block origin specifies the absolute address of the beginning of the measurement-block area on a 32-byte boundary in main storage. The measurement-block origin is passed from general register 2 to the measurement-block-update facility when SET CHANNEL MONITOR is executed with bit 62 of general register 1 set to One.

Measurement-Block Key Bits 32-35 of general register 1 form the four-bit access key to be used for subsequent measurement-block updates when SET CHANNEL MONITOR causes the measurement-block-update mode to be made active. The measurement-block key is passed to the measurement-block-update facility whenever the measurement-block origin is passed.

Measurement-Block Index The measurement-block index is set in the subchannel through the execution of MODIFY SUBCHANNEL. The measurement-block index specifies which 32-byte measurement block, relative to the measurement-block origin, is to be used for accumulating the measurement-block parameters for that subchannel. The location of the measurement block of a subchannel is computed by the measurement-block-update facility by appending five rightmost zeros to the measurement-block index of the subchannel and adding the result to the measurement-block origin. The result is the absolute address of the 32-byte measurement block for that subchannel. When the computed measurement-block address exceeds $2^{31}-1$, a measurement-block program-check condition is recognized, and measurement-block updating does not occur for the preceding subchannel-active Period.

Programming Note: The initial value of the measurement-block index is zero. The program is responsible for setting the measurement-block index to the proper value prior to enabling the subchannel for the measurement-block-update mode and making the mode active. To preclude the possibility of unpredictable results for the measured parameters in the measurement block, each subchannel for which measured parameters are to be accumulated must have a different value for its measurement-block index.

Measurement-Block-Update Mode: The measurement-block-update mode is made active by executing SET CHANNEL MONITOR with bit 62 of general register 1 set to one. If bit 62 of general register 1 is zero when SET CHANNEL MONITOR is executed, the mode is made inactive. When the measurement-block-update mode is inactive, no measurement values are accumulated in main storage. When the measurement block-update mode is made active, the contents of general register 2 are passed to the measurement-block-update facility as the absolute address of the measurement-block origin. The MBK is also passed to the measurement-block update facility as the access key to be used when updating the measurement block for each subchannel. When the measurement-block-update mode is active, the measurement-block-update facility accumulates measurements in individual measurement blocks within the measurement-block area for subchannels whose measurement block-update-enable bit is one.

If the measurement-block-update mode is already active when SET CHANNEL MONITOR is executed, the values for the measurement-block origin and measurement-block key that are used for a subchannel enabled for measuring by the measurement-block-update facility are dependent upon whether SET CHANNEL MONITOR is executed prior to, during, or subsequent to execution of START SUBCHANNEL for that subchannel. If SET CHANNEL MONITOR is executed prior to START SUBCHANNEL, the current measurement block origin and measurement-block key are in control. If SET CHANNEL MONITOR is executed during or subsequent to execution of START SUBCHANNEL, it is unpredictable whether the measurement-block origin and measurement-block key that are in control are old or current.

Measurement-Block-Update Enable Bit 11, word 1, of the SCHIB is the measurement block-update-enable bit. This bit provides the capability of controlling the accumulation of measurement-block parameters on a subchannel basis. The initial value of the enable bit is zero.

When MODIFY SUBCHANNEL is executed with the enable bit set to one in the SCHIB, the subchannel is enabled for the measurement-block-update mode. If the measurement-block-update mode is active, the measurement-block-update facility accumulates measurement-block parameters for the subchannel, starting with the next START SUBCHANNEL issued to that subchannel. Similarly, if MODIFY SUBCHANNEL is executed with bit 11 of word 1 of the SCHIB operand set to zero by the program, the subchannel is disabled for the measurement-block-update mode, and no additional measurement-block parameters are accumulated for that subchannel.

Control-Unit-Queuing Measurement: The control-unit-queuing-measurement facility allows the channel subsystem to accept queuing times from control units and, in conjunction with the measurement-block-update facility, to accumulate those times in the measurement block.

The System Library publication for the control-unit model specifies its ability to supply queuing time. If a control-unit model is capable of supplying queuing time, the publication specifies the conditions that prevent the control unit from accumulating an accurate control-unit-queuing time.

Control-Unit-Defer Time: The control-unit defer-time facility allows the channel subsystem to accept defer times from control units and, in conjunction with the measurement-block-update facility, to modify the device-connect and device disconnect times reported in the measurement block to reflect the defer time. The control-unit defer time is subtracted from the device-connect-time measurement and is added to the device-disconnect-time measurement reported for an I/O operation.

The System Library publication for the control-unit model specifies its ability to supply defer time. If a control-unit model is capable of supplying defer time, the publication specifies the conditions that prevent the control unit from accumulating an accurate control-unit-defer time.

Device-Active-Only Measurement The device-active-only-measurement facility permits the channel subsystem to report the times that the device is disconnected between primary status and secondary status at the end of an I/O operation or chain of I/O operations. The device actively-only time is accumulated into word 5 of the 32-byte measurement block. This time is not otherwise represented by the measurement data. When the device-active-only-measurement facility is not installed, measurement block updates are performed when the subchannel becomes status pending for primary status. When the device-active-only-measurement facility is installed, the measurement block updates are performed at the time that secondary status is accepted from the I/O device, in order that the device-active time between primary status and secondary status can be reported.

If the subchannel is start pending when secondary status is accepted from the I/O device and the measurement block update is to be performed, the measurement block update is performed prior to performing the start function. If measurement-block errors occur, they are reported to the program along with the secondary status instead of performing the start function.

Time-Interval-Measurement Accuracy On some models, when time intervals are to be measured and condition code 0 is set for START SUBCHANNEL (or RESUME SUBCHANNEL in the case of a suspended subchannel), a period of latency may occur prior to the initiation of the function-pending time measurement. The System Library publication for the system model specifies the mean latency value and variance for each of the measured time intervals.

Programming Notes:

1. Excessive delays may be encountered by the channel subsystem when attempting to update measurement data if the program is concurrently accessing the same measurement-block area. A programming convention should ensure that the storage block designated by SET CHANNEL MONITOR is made read-only while the measurement-block-update mode is Active.

2. To ensure that programs written to support measurement functions are executed properly, the program should initialize all the measurement blocks to zeros prior to making the measurement-block-update mode active. Only zeros should appear in the reserved and unused words of the measurement blocks.

3. When the incrementing of an accumulate value causes a carry to be propagated out of bit position 0, the carry is ignored, and accumulating continues from zero on.

Device-Connect-Time Measurement

The device-connect-time-measurement facility provides the program with the capability of retrieving the length of time that a device is actively communicating with the channel subsystem while executing a channel program. The measured length of time that the device spends actively communicating on a channel path during the execution of a channel program is called the device-connect-time interval (DCTI). Control-unit-defer time is not included in the DCTI.

If timing facilities are provided for the subchannel, the DCTI value is passed to the program in the extended-status word (ESW) at the completion of the operation when the primary-status condition is cleared by TEST SUBCHANNEL and when TEST SUBCHANNEL clears an intermediate-status condition alone while the subchannel is suspended. The DCTI value passed in the ESW pertains to the previous subchannel-active period. The passing of the DCTI in the ESW is under program control by the SET CHANNEL MONITOR device connect-time-measurement mode-control bit and the corresponding enable bit in the subchannel. However, the DCTI value is not stored in the ESW if the I/O function initiated by START SUBCHANNEL is terminated because of an error condition that is described by subchannel logout (see the section. In this case, the extended-status bit (L) of the SCSW is stored as one, indicating that the ESW contains logout information describing the error condition. If the accrued DCTI value exceeded 8.388608 seconds during the previous subchannel-active period, then the maximum value (FFFF hex) is passed in the ESW.

Device-Connect-Time-Measurement Mode The device-connect-time-measurement mode is made active by executing SET CHANNEL MONITOR when bit 63 of general register 1 is one. If bit 63 of general register 1 is zero when SET CHANNEL MONITOR is executed, the mode is made inactive, and DCTIs are not passed to the program. When timing facilities are provided for the subchannel, the device-connect-time-measurement mode is active, and the subchannel is enabled for the mode, the DCTI value is passed to the program in the ESW stored when TEST SUBCHANNEL (1) clears the primary-interruption condition with no logout information indicated in the SCSW (extended-status-word-format bit is zero) or (2) clears the intermediate-status condition alone while the subchannel is suspended.

If a start function is currently being executed with a subchannel enabled for the device-connect-time-measurement mode when SET CHANNEL MONITOR makes this mode active for the channel subsystem, the value of the DCTI stored under the appropriate conditions may be zero, a partial result, or the full and correct value, depending on the model and the progress of the start function at the time the mode was activated. Provision of the DCTI value in the measurement block area is not affected by whether the device connect-time-measurement mode is active.

Device-Connect-Time-Measurement Enable Bit 12, word 1, of the SCHIB is the device-connect-time measurement-mode enable bit. This bit provides the program with the capability of selectively controlling the storing of DCTI values for a subchannel when the device-connect-time-measurement mode is active. The initial value of the enable bit is zero. When this enable bit is one in the SCHIB and MODIFY SUBCHANNEL is executed, the subchannel is enabled for the device-connect-time-measurement mode. If the device-connect-time-measurement mode is active, the device-connect-time-measurement facility begins providing DCTI values for the subchannel, starting with the next START SUBCHANNEL issued to the subchannel. In this situation, the DCTI values are provided in the ESW. Similarly, if MODIFY SUBCHANNEL is executed with bit 12, word 1, of the SCHIB operand set to zero by the program, the subchannel is disabled for the device-connect-time-measurement mode, and no further DCTI values are passed to the program for that subchannel.

Signals and Resets

During system operation, it may become necessary to terminate an I/O operation or to reset either the I/O system or a portion of the I/O system. (The I/O system consists of the channel subsystem plus all of the attached control units and devices.) Various signals and resets are provided for this purpose. Three signals are provided for the channel subsystem to notify an I/O device to terminate an operation or perform a reset function or both. Two resets are provided to cause the channel subsystem to reinitialize certain information contained either at the I/O device or at the channel subsystem.

Based on the foregoing, enhancements are needed in obtaining measurement data. For example, a need exists for a capability that enhances the measurement blocks and the storage thereof. Further, a need exists for an improved capability for obtaining measurement data for a single operation.

SUMMARY OF THE INVENTION

The shortcomings of the prior art are overcome and additional advantages are provided through the provision of a method of facilitating access to measurement data of a computing environment. The method includes, for instance, obtaining measurement data for an I/O operation directly from a measurement unit, wherein the measurement unit includes measurement data exclusive to the selected I/O operation.

In a further aspect of the present invention, a method of accessing measurement blocks of a computing environment is provided. The method includes, for instance, using a measurement block address to directly access a measurement block associated with an input/output (I/O) component of the computing environment, wherein the measurement block is accessed absent use of a measurement block origin and measurement block index.

In yet a further aspect of the present invention, a method of facilitating access to measurement data of a computing environment is provided. The method includes, for instance, providing for one or more I/O components of an I/O path of a control unit of the computing environment individual time measurement data specific to the one or more I/O components.

System and computer program products corresponding to the above-summarized methods are also described and claimed herein.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 3 depicts one embodiment of an extended secondary queue measurement block, in accordance with an aspect of the present invention;

BEST MODE FOR CARRYING OUT THE INVENTION

In accordance with an aspect of the present invention, an extended measurement block facility is provided in which measurement blocks are stored in discontiguous memory and can be accessed via a measurement block address rather than by using a measurement block origin and measurement block index. Further, in one aspect of the invention, the measurement block is extended to include additional information. In yet a further aspect of the present invention, an extended measurement word facility is provided in which measurement data for a single I/O operation is returned directly to the program without having the program calculate the measurement data for that I/O operation. This is facilitated by an extended measurement word that is returned along with the ending status of the I/O operation via an instruction. In one example, one or more measurement fields in the extended measurement word may be stored with a time resolution of approximately one-half microsecond to provide the accuracy needed for measurements associated with the single I/O operation.

Figure 1A:
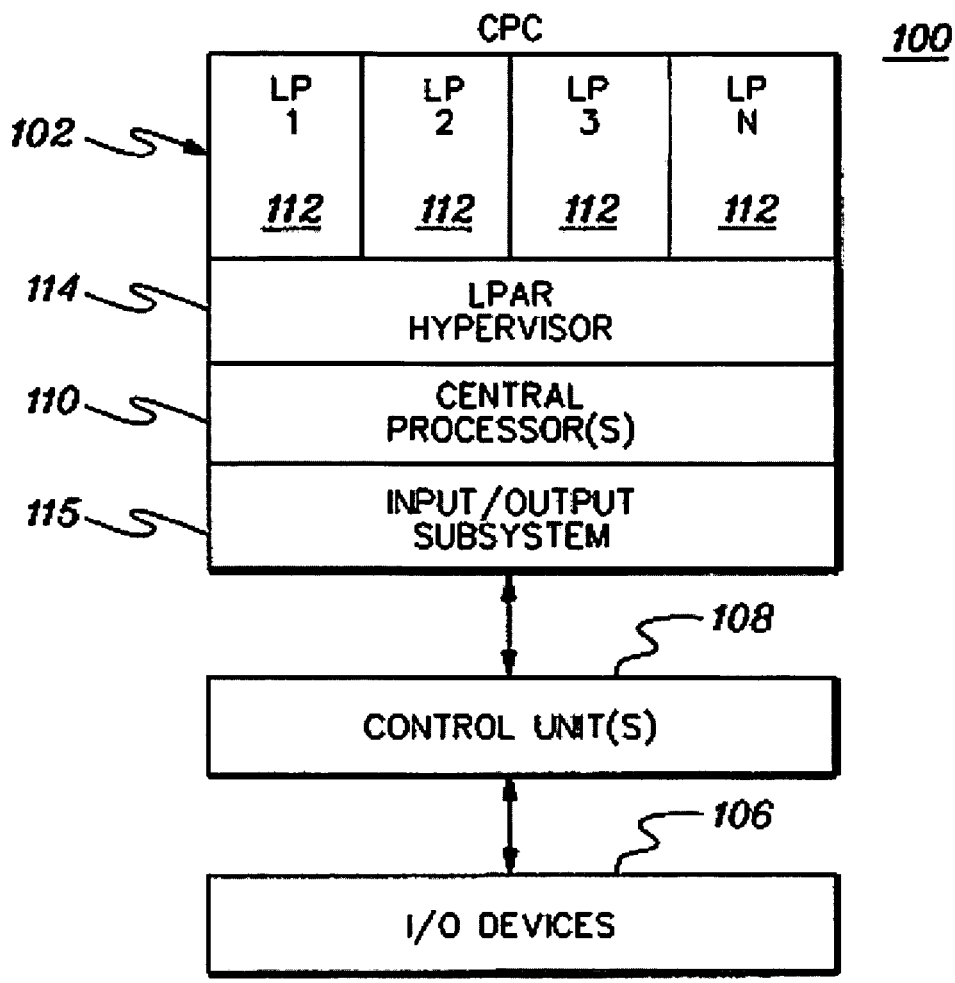
FIG. 1a depicts one embodiment of a computing environment to incorporate and use one or more aspects of the present invention.

One embodiment of a computing environment to incorporate and use one or more aspects of the present invention is described with reference to FIG. 1a. In one example, computing environment 100 is based on the z/Architecture, offered by International Business Machines Corporation, Armonk, N.Y. The z/Architecture is described in an IBM Publication entitled "z/Architecture Principles of Operation," Publication No. SA22-7832-01, October 2001, which is hereby incorporated herein by reference in its entirety.

As one example, computing environment 100 includes a central processor complex (CPC) 102 coupled to one or more input/output (I/O) devices 106 via one or more control units 108. Central processor complex 102 includes, for instance, one or more central processors 110, one or more partitions 112 (e.g., logical partitions (LP)), a logical partition hypervisor 114, and an input/output subsystem 115, each of which is described below.

Central processors 110 are physical processor resources allocated to the logical partition. In particular, each logical partition 112 has one or more logical processors, each of which represents all or a share of a physical processor 110 allocated to the partition. The physical processors to which the logical processors are dispatched (by the hypervisor) may be either dedicated to a given partition's logical processors or shared by logical processors configured to multiple sharing logical partitions.

A logical partition functions as a separate system and has one or more applications and a resident operating system therein, which may differ for each logical partition. In one embodiment, the operating system is the z/OS operating system, the z/VM operating system, the Linux on zSeries operating system or the TPF operating system, offered by International Business Machines Corporation, Armonk, N.Y.

Logical partitions 112 are managed by a logical partition hypervisor 114, which is implemented by Licensed Internal Code running on processors 110. The logical partitions and logical partition hypervisor each comprise one or more programs residing in respective partitions of central storage associated with the central processors. One example of logical partition hypervisor 114 is the Processor Resource/System Manager (PR/SM), offered by International Business Machines Corporation, Armonk, N.Y. Further details regarding logical partitions are described in, for instance, Guyette et al., U.S. Pat. No. 4,564,903, entitled "Partitioned Multiprocessor Programming System," issued on Jan. 14, 1986; Bean et al., U.S. Pat. No. 4,843,541, entitled "Logical Resource Partitioning Of A Data Processing System," issued on Jun. 27, 1989; and Kubala, U.S. Pat. No. 5,564,040, entitled "Method And Apparatus For Providing A Server Function In A Logically Partitioned Hardware Machine," issued on Oct. 8, 1996, each of which is hereby incorporated herein by reference in its entirety.

Input/output subsystem 115 directs the flow of information between input/output devices 106 and main storage. It is coupled to the central processing complex, in that it can be a part of the central processing complex or separate therefrom. The I/O subsystem relieves the central processors of the task of communicating directly with the input/output devices and permits data processing to proceed concurrently with input/output processing. To provide communications, the I/O subsystem employs I/O communications adapters. There are various types of communications adapters including, for instance, channels, I/O adapters, PCI cards, Ethernet cards, Small Computer Storage Interface (SCSI) cards, etc. In the particular example described herein, the I/O communications adapters are channels, and therefore, the I/O subsystem is referred to herein as a channel subsystem. However, this is only one example. Other types of I/O subsystems can incorporate and use one or more aspects of the present invention.

Figure 1B:
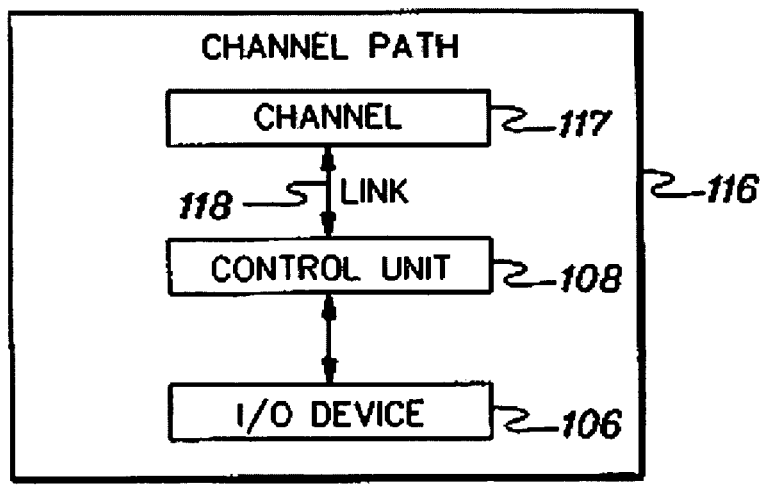
FIG. 1b depicts one example of an I/O path (e.g., a channel path) used for communications in the computing environment of FIG. 1a, in accordance with an aspect of the present invention.

The I/O subsystem uses one or more input/output paths as communication links in managing the flow of information to or from input/output devices 106. In this particular example, these paths are called channel paths, since the communications adapters are channels. Each channel path 116 (FIG. 1b) includes a channel 117 of channel subsystem 115, a control unit 108, a link 118 (e.g., serial or parallel) between the channel and control unit, and one or more I/O devices 106 coupled to the control unit. In other embodiments, channel paths may have multiple control units and/or other components. Further, in another example, it is also possible to have one or more dynamic switches as part of the channel path. A dynamic switch is coupled to a channel and a control unit and provides the capability of physically interconnecting any two links that are attached to the switch. Further details regarding channel subsystems are described in Casper et al., U.S. Pat. No. 5,526,484, entitled, "Method And System For Pipelining The Processing Of Channel Command Words," issued on Jun. 11, 1996, which is hereby incorporated herein by reference in its entirety.

A control unit may be accessible by the channel subsystem by more than one channel path. Similarly, an I/O device may be accessible by the channel subsystem through more than one control unit, each having one or more channel paths to the channel subsystem. The control unit accepts control signals from the channel subsystem, controls the timing of data transfer over the channel path, and provides indications concerning the status of the device. The control unit may be housed separately or it may be physically and logically integrated with the I/O device, the channel subsystem, or a central processor.

The I/O device attached to the control unit may be designed to perform certain limited operations, or it may perform many different operations. To accomplish its operations, the device uses detailed signal sequences peculiar to its type of device. The control unit decodes the commands received from the channel subsystem, interprets them for the particular type of device, and provides the signal sequence required for the performance of the operation.

In addition to one or more channels, a channel subsystem includes one or more subchannels. Each subchannel is provided for and dedicated to an I/O device coupled to the program through the channel subsystem. Each subchannel provides information concerning the associated I/O device and its attachment to the channel subsystem. The subchannel also provides information concerning I/O operations and functions involving the associated I/O device. The subchannel provides a logical appearance of a device to the program and is the means by which the channel subsystem provides information about associated I/O devices to the central processors, which obtain this information by executing machine I/O instructions (e.g., a store subchannel instruction). The subchannel has internal storage that includes information in the form of a channel command word (CCW) address, one or more channel path identifiers, device number, count, status indication, I/O interruption subclass code, information on path availability and functions pending or being performed, as well as information associated with one or more aspects of the present invention, as described below. I/O operations are initiated and terminated with a device by the execution of I/O instructions that designate the subchannel associated with the device.

Figure 1C:
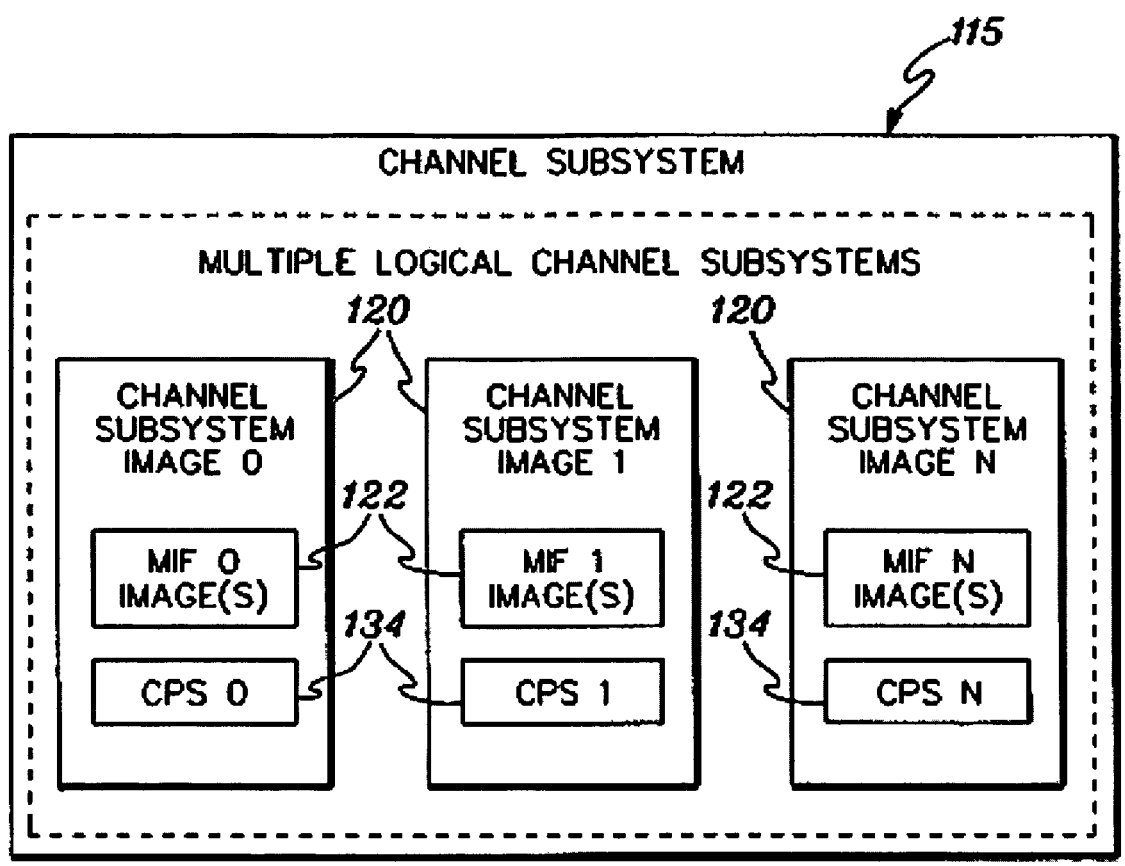
FIG. 1c depicts one embodiment of an example of an I/O subsystem (e.g., a channel subsystem) of FIG. 1a being configured as a plurality of I/O subsystem (e.g., channel subsystem) images, in accordance with an aspect of the present invention.

Further details regarding a channel subsystem are described with reference to FIG. 1c. A channel subsystem 115 (or other I/O subsystem) is configured as a plurality of channel subsystem images 120 (or other I/O subsystem images), each identified by a channel subsystem image identifier (CSSID) (or other I/O subsystem identifier). In one example, the channel subsystem is configured, either by model dependent means, in which configuration controls are used during initialization, or by use of appropriate dynamic I/O configuration commands, as one to 256 channel subsystem images. Each channel subsystem image appears to a program as a complete channel subsystem. Each channel subsystem image may have, for instance, from 1 to 256 unique channel paths, thereby increasing the maximum number of channel paths that may be configured to the channel subsystem from 256 to 65,536. The configuring of the channel subsystem as a plurality of channel subsystem images is facilitated by a Multiple Channel Subsystem facility (MCSS), one embodiment of which is described in a U.S. patent application entitled "Multiple Logical Input/Output Subsystem Facility," Brice et al., (IBM Docket No. POU920020071US1), filed herewith and incorporated herein by reference in its entirety.

A channel subsystem image 120 includes, for instance, a multiple image facility (MIF) 122, which includes one or more (e.g., up to 16) MIF images, each identified by a MIF image identifier (IID). The multiple image facility allows each logical partition to achieve independent access to the channel paths, control units and I/O devices that are configured to and dynamically shared by multiple logical partitions.

Figure 1D:
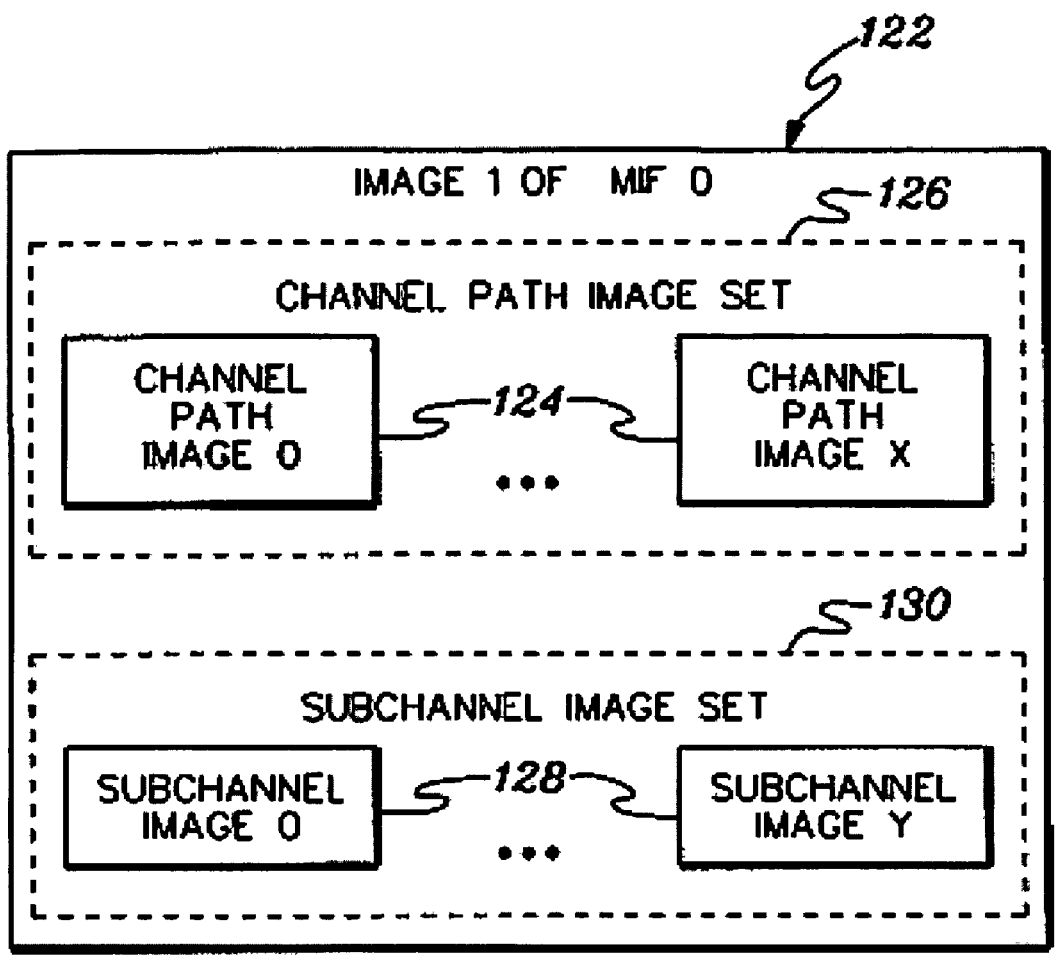
FIG. 1d depicts further details of a multiple image facility (MIF) image of a channel subsystem image of FIG. 1c, in accordance with an aspect of the present invention.

As shown in FIG. 1d, for each MIF image, a separate set of channel path controls and a separate set of subchannel controls are provided by the channel subsystem. For each MIF image, each set of channel path controls for each configured channel path is called a channel path image 124. The collection of one or more channel path images associated with the channel paths that are configured to a MIF image is called a channel path image set 126. Further, for each MIF image, a separate subchannel, called a subchannel image 128, is provided for each I/O device that is configured to the MIF image. A collection of one or more subchannel images that are configured to a MIF image is called a subchannel image set 130.

Figure 1E:
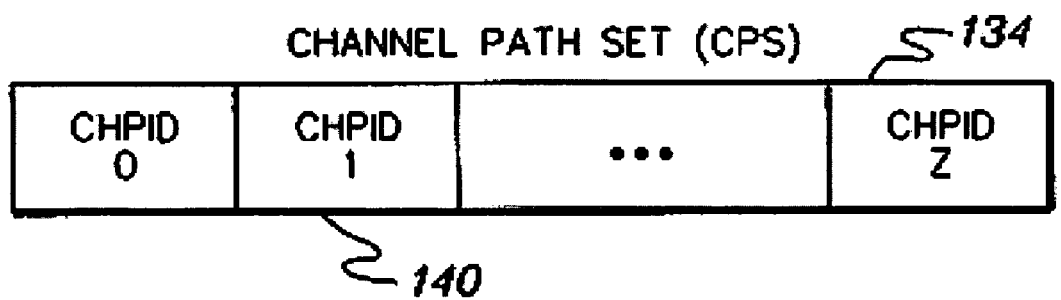
FIG. 1e depicts further details of a channel path set (CPS) of a channel subsystem image of FIG. 1c, in accordance with an aspect of the present invention.

Referring back to FIG. 1c, in addition to a MIF, a channel subsystem image 120 also includes a channel path set (CPS) 134. Channel path set 134 includes, for instance, one to 256 channel paths 140 (FIG. 1e) configured to one or more channel path images in the associated MIF. Each channel path is identified by a channel path identifier (CHPID). Each channel path configured to a channel path set may be unique from other channel paths configured to other provided channel subsystem images. However, because as many as 256 channel subsystem images may be provided, the CHPID values assigned to channel paths in each of the channel path sets may not be unique. Therefore, each channel path is specified by a unique address formed by, for instance, a concatenation of CSSID with the channel path identifier assigned to the channel path. The image ID (IID) further identifies a channel path image for each configured channel path.

The performance of a computing environment is monitored to detect and correct inefficiencies in performance with a goal of improving system performance. In order to monitor system performance, measurement data is collected and analyzed. Measurement data is also collected to facilitate in accounting, as well as capacity planning. As one example, measurement data relating to I/O operations is collected and stored in measurement blocks assigned to devices. For example, a measurement block is defined for each subchannel for which measurement data is to be collected and data is stored in the block by, for instance, the channel subsystem during performance of one or more I/O operations.

In accordance with an aspect of the present invention, the measurement blocks for the subchannels are located in discontiguous areas of main real storage, and are accessed by unique measurement block addresses. By using an address, the channel subsystem can directly access a channel measurement block without having to use a measurement block origin or measurement block index. Measurement blocks can be individually allocated or deallocated as subchannels are dynamically added or removed, respectively. In one example, an address of a measurement block is assigned to a subchannel via an instruction, such as a modify subchannel instruction. This allows the channel subsystem to use the address to directly access the measurement block.

Figure 2:
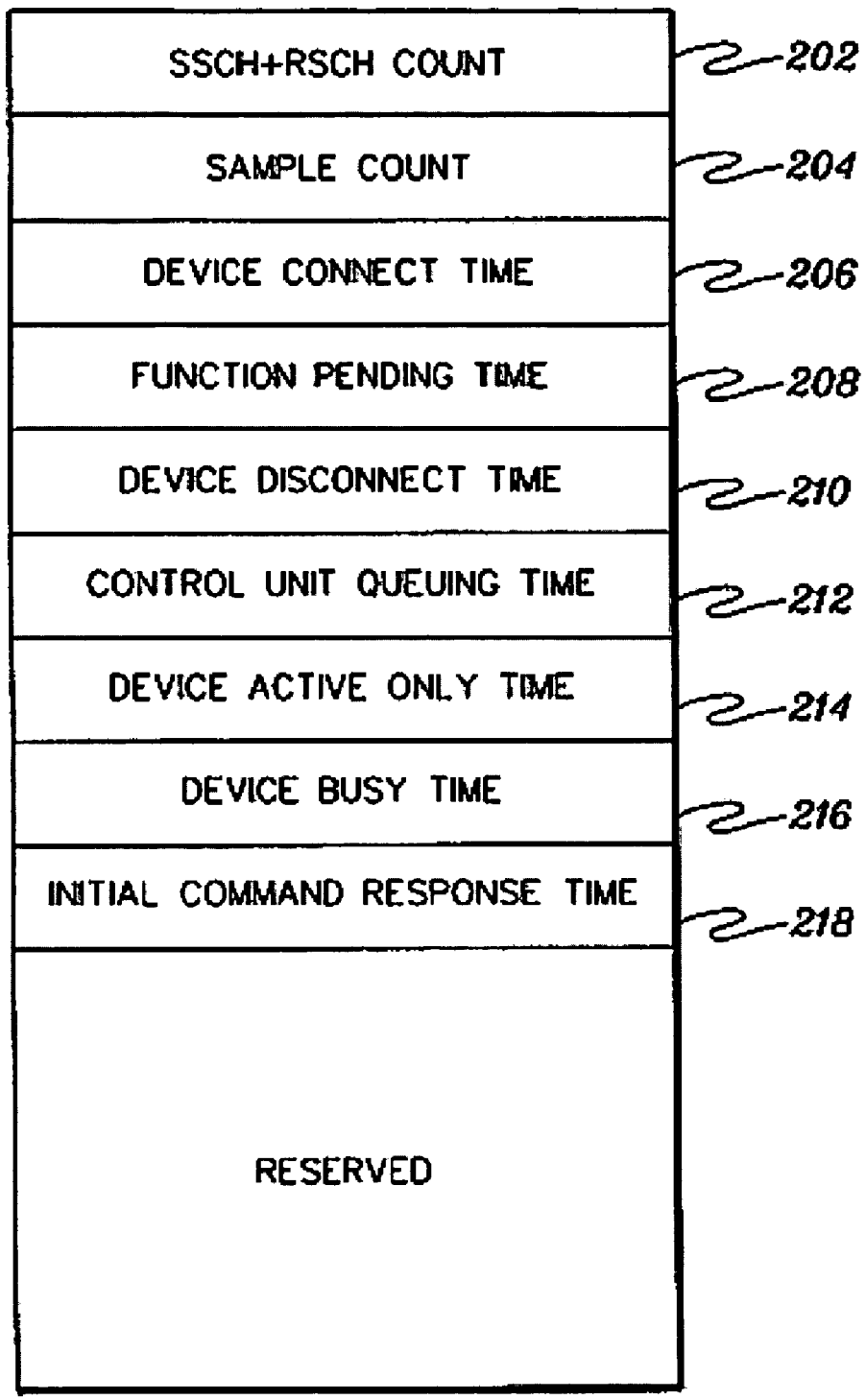
FIG. 2 depicts one example of an extended channel measurement block, in accordance with an aspect of the present invention.

One example of a measurement block is described with reference to FIG. 2. In this example, the measurement block has a 64 byte format and thus, is referred to herein as an extended measurement block. Some of the fields of the measurement block are further described in an IBM Publication entitled "z/Architecture Principles of Operation," Publication No. SA22-7832-01, October 2001, which is hereby incorporated herein by reference in its entirety. In one example, a measurement block 200 includes the following fields:

a) SSCH+RSCH Count 202: This field is used as a counter during performance of a start I/O function, such as a start subchannel function, and/or resume function.

b) Sample Count 204: This field is used as a counter when the time accumulation fields of the measurement block, described below, are updated.

c) Device Connect Time 206: This field includes the accumulation of measured device connect time intervals. The device connect time interval is the sum of the time intervals measured whenever the device is logically connected to a channel path, while the subchannel is subchannel active and the device is actively communicating with the channel path.

d) Function Pending Time 208: This field includes the accumulated SSCH- and RSCH-function pending time. The function pending time is the time interval between acceptance of the start function (or resume function if the subchannel is in the suspended state) at the subchannel and acceptance of the first command associated with the initiation or resumption of channel program execution at the device.

e) Device Disconnect Time 210: This field includes the accumulated device disconnect time. The device disconnect time is the sum of the time intervals measured whenever the device is logically disconnected from the channel subsystem while the subchannel is subchannel active. The device disconnect time also includes the sum of control unit defer time intervals reported by the device during the I/O operation.

f) Control Unit Queuing Time 212: This field includes the accumulated control unit queuing time. Control unit queuing time is the sum of the time intervals measured by the control unit whenever the device is logically disconnected from the channel subsystem during an I/O operation while the device is busy with an operation initiated from a different system.

g) Device Active Only Time 214: This field includes the accumulated device active only time. Device active only time is the sum of the time intervals when the subchannel is device active, but not subchannel active at the end of an I/O operation or chain of I/O operations initiated by a start function or resume function.

h) Device Busy Time 216: This field includes the accumulated device busy time. Device busy time is the sum of the time intervals when the subchannel is device busy during an attempt to initiate a start function or resume function at the subchannel. The device busy time field is updated such that a bit (e.g., the last bit) represents, for instance, 128 microseconds. The accumulated value is modulo approximately 152.71 hours.

i) Initial Command Response Time 218: This field includes the accumulated initial command response time for the subchannel. The initial command response time for a start or resume function is the time interval beginning from when the first command of the channel program is sent to the device until the device indicates it has accepted the command. The initial command response time is stored at a resolution of, for instance, 128 microseconds. The accumulated value is modulo approximately 152.71 hours.

The information in an extended measurement block is accessible by the operating system by using virtual addressing to locate the measurement block in main memory.

In addition to obtaining the above described measurement data, data is also obtained that is associated with one or more secondary queues associated with one or more subchannels. A secondary queue is a queue of I/O requests that the channel subsystem has begun to process, but is unable to complete because of a busy condition in the I/O configuration. The channel subsystem stores data in the queue as it encounters busy conditions for the various I/O components associated with the I/O requests.

One example of a secondary queue measurement block is described with reference to FIG. 3. In this example, the secondary queue measurement block has a 64 word format and thus, is referred to herein as an extended secondary queue measurement block. In one example, an extended secondary queue measurement block 300 includes, for instance, the following:

a) Queue Valid Indicator (B) 302: This indicator indicates whether the specified secondary queue is valid. A secondary queue is valid when it exists within the channel subsystem.

b) Queue Out Of Range (R) 304: This field indicates that the specified secondary queue does not exist within the channel subsystem and that any queue number greater than the specified queue number also does not exist within the channel subsystem.

c) Queue Count 306: This field indicates the current length of a specified secondary queue. The length of the queue is determined by the number of subchannels on the associated secondary queue that are function pending and are delayed because of busy conditions.

d) Queue Number 308: This field includes the identity of the secondary queue to which the information in this secondary queue measurement block applies.

e) Summation of Queue Counts 310: This field includes an accumulation of the queue count field. The queue count field is added to the summation at the time a subchannel is added to the specified secondary queue, and the count includes this addition of the subchannel to the specified secondary queue.

f) Summation of Enqueues 312: This field includes a count of the number of times a subchannel is added to the specified secondary queue.

g) Summation of Channel Wait Time 314: This field includes the summation of the channel wait time encountered by the channel subsystem for each SSCH or RSCH function initiated to devices attached to this secondary queue. The channel wait time for a SSCH or RSCH function is that portion of the function pending time that cannot be attributed to a control unit busy, device busy or destination busy condition on a channel path. It is the time interval between acceptance of the start or resume function at the subchannel until the channel subsystem first attempts to initiate the operation on a channel path. The summation of the channel wait time is stored at a resolution of, for instance, 128 microseconds. The accumulated value is modulo approximately 152.71 hours.

h) Switch Busy Counts 316: This field includes a count of the number of times an initial selection sequence for a start or halt function resulted in a switch busy response on the corresponding channel path. Each switch busy count field (e.g., 0 to 7) corresponds one for one, by relative position, with the path installed mask (PIM) bits of the subchannels associated with the specified secondary queue. The path installed mask indicates which of the channel paths 0-7 to an I/O device are physically installed.

i) Control Unit Busy Counts 318: This field includes a count of the number of times an initial selection sequence for a start or halt function resulted in a control unit busy response on the corresponding channel path. Each control unit busy count field corresponds one for one, by relative position, with the PIM bits of the subchannels associated with the specified secondary queue.

j) Success Counts 320: The success counts fields include a count of the number of times an initial selection sequence for a start function resulted in the device accepting the first command of the channel program on the corresponding channel path. Each success count field corresponds one for one, by relative position, with the PIM bits of the subchannels associated with the specified secondary queue.

k) Control Unit Busy Time Fields 322: These fields include the accumulated control unit busy time for the channel paths on a specified secondary queue. Control unit busy time is accumulated for a channel path from the time an initial selection sequence for a start or halt receives a control unit busy indication until a control unit end condition is recognized on the path. The control unit busy time is stored at a resolution of, for instance, 128 microseconds. The accumulated value is modulo approximately 152.71 hours.

l) Initial Command Response Time Fields 324: These fields include the accumulated initial command response time for start or resume functions successfully initiated on the channel path for the specified secondary queue. The initial command response time for a start or resume function is the time interval beginning from when the first command of the channel program is sent to the device until the device indicates it has accepted the command. The initial command response time is stored at a resolution of, for instance, 128 microseconds. The accumulated value is modulo approximately 152.71 hours.

m) Switch Busy Count Summation Fields 326: These fields include a summation of the switch busy counts received for all partitions for the corresponding channel path on the specified secondary queue. Each switch busy count summation field corresponds one for one, by relative position, with the PIM bits of the subchannels associated with the specified secondary queue. In one example, the extended secondary queue measurement block is returned as part of executing a command, such as a store secondary queue measurement data command. The store secondary queue measurement data command is used to obtain the measurement data for a range of secondary queues (e.g., logical control unit queues) maintained by the channel subsystem. Information is returned to the program in the form of a 64 word extended secondary queue measurement block. The information returned includes general queuing statistics and measurement information for each of the channels attached to the secondary queue (up to 8 channels may be attached to a secondary queue, in one example).

Figure 4A:
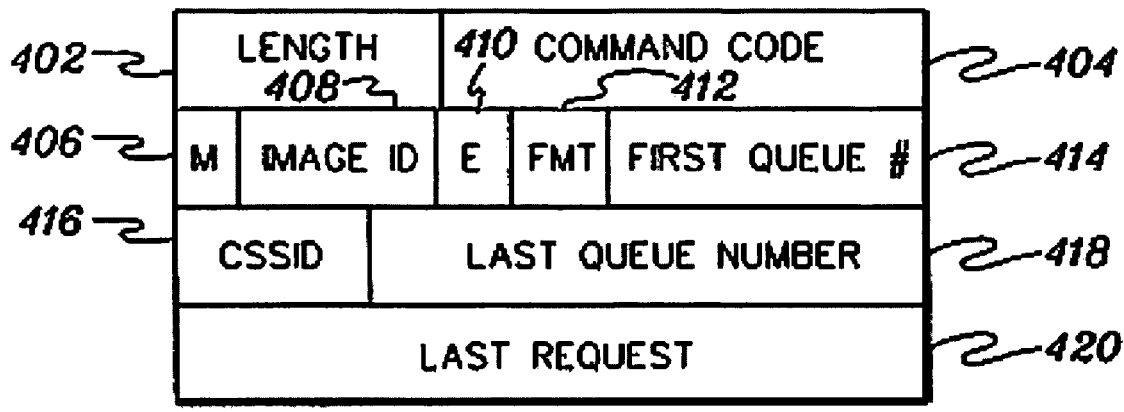
FIG. 4a depicts one embodiment of a request block for a store secondary queue measurement data command used in accordance with an aspect of the present invention.

One embodiment of a command request block for a store secondary queue measurement data command is described with reference to FIG. 4a. In the example described herein, it is assumed that the environment is a logical partitioned environment and that the multiple channel subsystem facility is provided by the CPC. Since the multiple channel subsystem facility is provided, the secondary queue measurement data for a specified range of target queues is defined within a channel subsystem image that is specified by the effective CSSID. In one example, a command request block for the store secondary queue measurement data command 400 includes, for instance, the following:

a) Length Field 402: This field specifies the length of the command request block.
b) Command Code 404: This field specifies the store secondary queue measurement data command.
c) Multiple Channel Subsystem Bit (M) 406: This field indicates that the CSSID field is to be checked for a valid CSSID. If valid, the value in the CSSID field becomes the effective CSSID. If not valid, then a response code may be stored. When M is zero, the default CSSID is the effective CSSID, and the CSSID field is to be zero.
d) MIF Image ID (IID) 408: This field is set to zeros.
e) Extended I/O Measurement Block Format (E) 410: This field specifies the format of the response block that is to be stored in response to the command request. In one example, a format of one indicates the extended channel secondary queue measurement block.
f) Format (FMT) 412: This field indicates the command request format field whose value specifies the layout of the command request block. In one example, the value of this field is zero.
g) First Queue Number 414: This field specifies the first secondary queue for which information is requested.
h) CSSID 416: This field includes the CSSID of the channel subsystem image that is associated with the specified range of target queues. The CSSID is subject to range, existence and authorization checking.
i) Last Queue Number 418: This field specifies the last secondary queue for which information is requested.
j) Last Request 420: This field when set indicates that this is the last request for measurement data for the specified secondary queues.

Figure 4B:
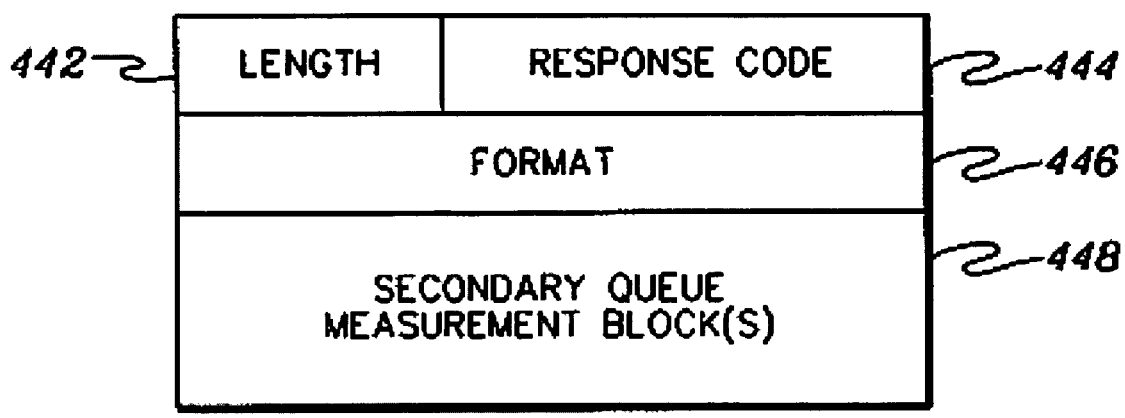
FIG. 4b depicts one embodiment of a response block for the store secondary queue measurement data command of FIG. 4a, in accordance with an aspect of the present invention.

One embodiment of a command response block for the store secondary queue measurement data command is depicted in FIG. 4b. In one example, a command response block 440 for a store secondary queue measurement data command includes the following fields:

a) Length Field 442: This field specifies the length of the command response block. The length depends, for instance, on the response code that is stored as a result of the attempt to execute the store secondary queue measurement data command.
b) Response Code 444: This field describes the results of the attempt to execute the store secondary queue measurement data command.
c) Format 446: This field includes a value that specifies the layout of the command response block. In one example, the value is one indicating a Format 1 command response block, which corresponds to an extended block of, for instance, 64 words.
d) Secondary Queue Measurement Block(s) 448: In one example, up to 15 Format 1 secondary queue measurement blocks are stored in the response data area of the command response block. The number of secondary queue measurement blocks stored depends on, for instance, the number of secondary queues in the range specified in the command response block; conditions in the channel subsystem; and the channel subsystem model.

At least one secondary queue measurement block is stored and the actual number of blocks stored is determined by subtracting 8 bytes from the size of the command response block and dividing by the size of each of the secondary queue measurement blocks stored, as indicated by the format field in the command response block.

As described above, extended measurement blocks provide various kinds of measurements used in performing workload and/or performance tuning on various machines. For compatibility with some operating systems, a measurement block format field is added to the subchannel to indicate whether a non-extended format or the new extended format measurement block is to be stored for a subchannel. Similarly, as described above, a field in the store secondary queue measurement data command (e.g., extended I/O measurement block format (E) 410) is used to request that the extended response block be stored for the command.

In addition to the extended I/O measurement block facility, an extended I/O measurement word facility is provided, in accordance with a further aspect of the present invention. This facility facilitates the efficient obtaining of measurement data for a single I/O operation. It enables a machine to return measurement data to the program (e.g., operating system) for a given I/O operation without requiring the program to calculate the data for that I/O operation. In one example, the extended I/O measurement word facility is enabled in the z/Architecture by executing a command that conveys information for a program to the channel subsystem. The command includes an operation code that specifies the particular operation (e.g., enable the extended I/O measurement word facility) to be performed.

Figure 5:
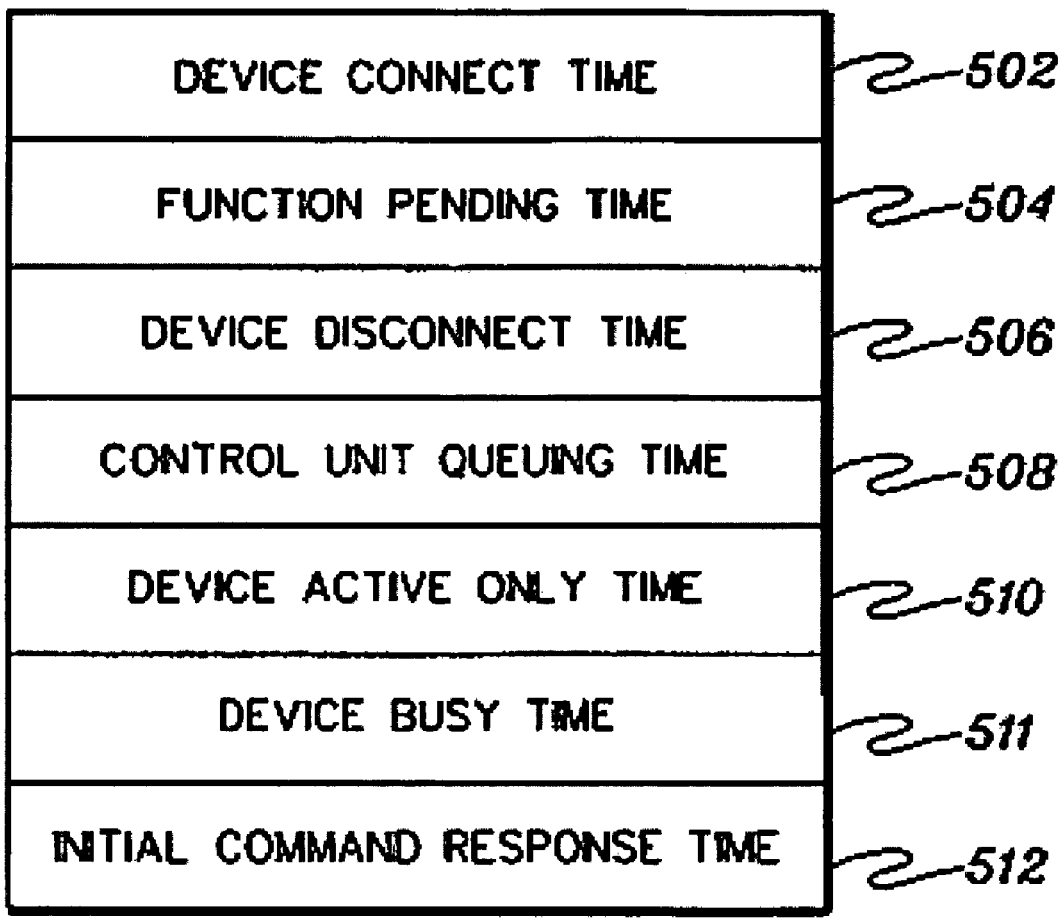
FIG. 5 depicts one embodiment of an extended measurement word, in accordance with an aspect of the present invention.

The measurement information for a particular I/O operation is stored into an extended measurement word (EMW). One embodiment of an extended measurement word is described with reference to FIG. 5. In one example, an extended measurement word 500 includes, for instance, the following:

a) Device Connect Time 502: This field includes the accumulation of measured device connect time intervals. The device connect time interval is the sum of the time intervals measured whenever the device is logically connected to a channel path, while the subchannel is subchannel active and the device is actively communicating with the channel path.
b) Function Pending Time 504: This field includes the accumulated SSCH- and RSCH-function pending time. The function pending time is the time interval between acceptance of the start function (or resume function if the subchannel is in the suspended state) at the subchannel and acceptance of the first command associated with the initiation or resumption of channel program execution at the device.

c) Device Disconnect Time 506: This field includes the accumulated device disconnect time. The device disconnect time is the sum of the time intervals measured whenever the device is logically disconnected from the channel subsystem while the subchannel is subchannel active. The device disconnect time also includes the sum of control unit defer time intervals reported by the device during the I/O operation.

d) Control Unit Queuing Time 508: This field includes the accumulated control unit queuing time. Control unit queuing time is the sum of the time intervals measured by the control unit whenever the device is logically disconnected from the channel subsystem during an I/O operation while the device is busy with an operation initiated from a different system.

e) Device Active Only Time 510: This field includes the accumulated device active only time. Device active only time is the sum of the time intervals when the subchannel is device active, but not subchannel active at the end of an I/O operation or chain of I/O operations initiated by a start function or resume function.

f) Device Busy Time 511: This field includes the accumulated device busy time. Device busy time is the sum of the time intervals when the subchannel is device busy during an attempt to initiate a start function or resume function at the subchannel.

g) Initial Command Response Time 512: This field includes the accumulated initial command response time for the subchannel. The initial command response time for a start or resume function is the time interval beginning from when the first command of the channel program is sent to the device until the device indicates it has accepted the command.

The extended measurement word eliminates the need for the program to fetch the channel measurement block both before and after an I/O operation in order to calculate the measurement data for that specific operation. In one example, each measurement field in the EMW may be stored with a time resolution of as low as one-half microsecond (via the low order bits of the counters) to provide the accuracy desired for measurements associated with a single I/O operation. For example, the channel subsystem timing facility provides a timer with a resolution that is appropriate for the speed of the I/O operations supported by the subsystem. The extended measurement word is returned in an interruption response block (IRB) obtained by issuing, for instance, a test subchannel instruction. General register 1, which is an implied operand for the instruction, includes the subsystem identification word that designates the subchannel for which the information is to be stored. The second operand address designated in the instruction is the logical address of the IRB. The interruption response block includes, for instance, a subchannel status word, an extended status word, an extended control block and the extended measurement word. Further details regarding an IRB and the test subchannel instruction, without the extensions of the present invention, are described in an IBM Publication entitled "z/Architecture Principles of Operation," Publication No. SA22-7832-01, October 2001, which is hereby incorporated herein by reference in its entirety.

Figure 6:
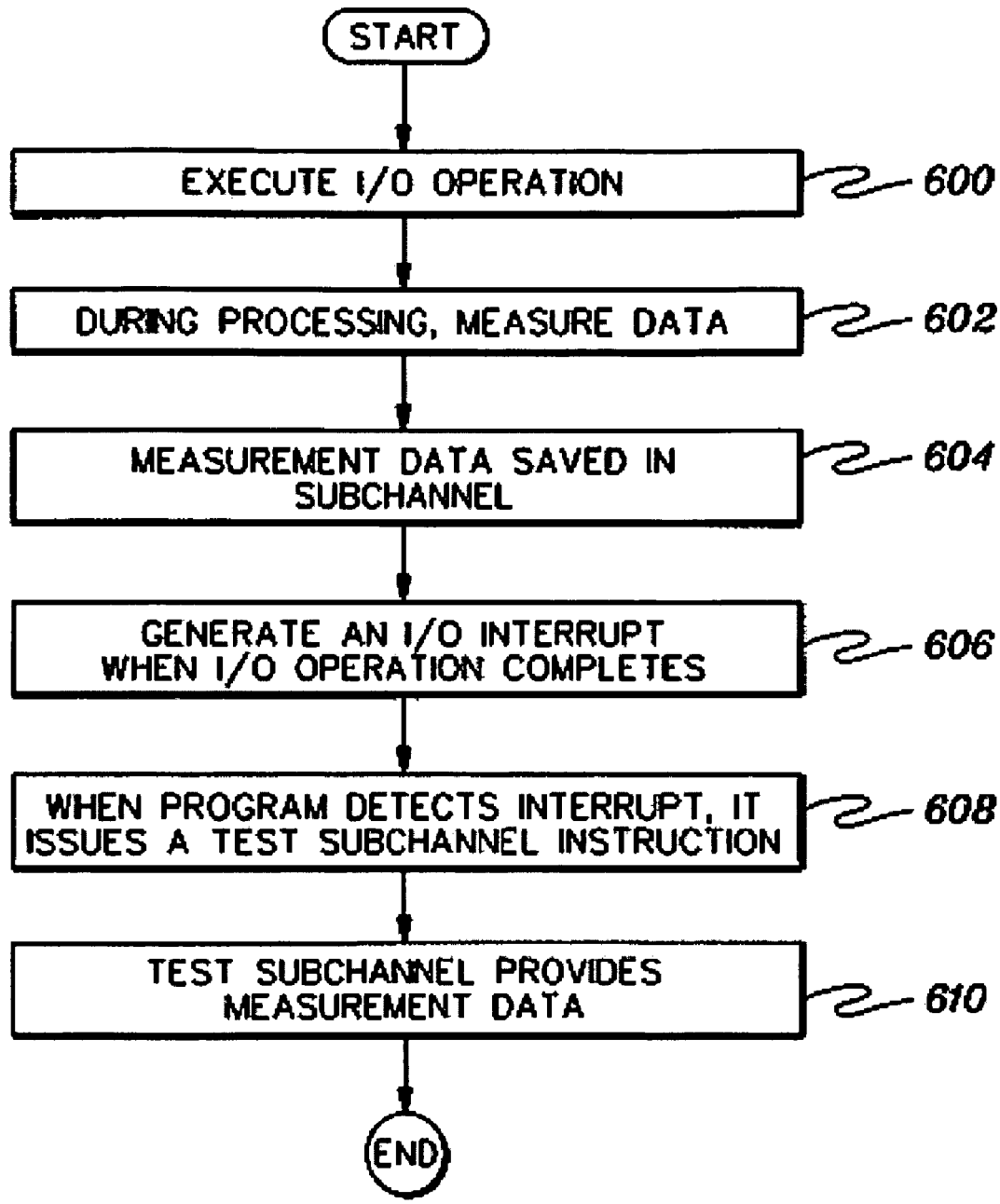
FIG. 6 depicts one embodiment of the logic associated with generating the extended measurement word and providing it to a program, in accordance with an aspect of the present invention.

One embodiment of the logic associated with obtaining the extended measurement word, in accordance with an aspect of the present invention, is described with reference to FIG. 6. Initially, an I/O operation, such as a start subchannel instruction, is executed, STEP 600. During processing of the I/O operation, measurement data is obtained by the channel subsystem, STEP 602. In one example, the types of data that are obtained are those described in the extended measurement word described above. In other examples, the types of data stored may be different. The actual calculation of the data can be performed in various ways, as known to those skilled in the art.

The measurement data that is collected is saved in the subchannel, STEP 604. In one example, it is stored in an internal control block within the subchannel. In response to completion of the I/O operation, an I/O interrupt is generated, STEP 606. When the program (e.g., the operating system) detects the interrupt, it issues a test subchannel instruction, STEP 608. The test subchannel instruction pulls the information from the subchannel control block and places it in the EMW which is returned as part of the IRB, STEP 610. The extended measurement word includes I/O measurement information for the most recent start or resume operation performed at the subchannel. Thus, this enables data to be provided for a single I/O operation. Each field in the EMW, when valid, includes a count in which each increment of the count represents a value of, for instance, 0.5 microseconds.

For compatibility with other operating systems, an extended measurement word enable field is added to the subchannel to indicate whether the extended measurement word should be stored in the IRB. When the enable field indicates the subchannel is enabled for extended measurement word mode, measurement data is stored in the EMW at the time channel program execution is completed, or suspended at the subchannel or completed at the device, as appropriate.

Described in detail above are measurement facilities that facilitate the obtaining of measurement data associated with subchannels of a channel subsystem. Advantageously, the extended I/O measurement facility allows for additional measurement information to be stored and removes the need to allocate a single contiguous channel measurement block area in main real storage. Instead, each subchannel is assigned a unique measurement block address that identifies the location of a channel measurement block for the associated device. Use of this facility allows the channel subsystem to directly access the channel measurement blocks without having to use measurement block origins and measurement block indexes to locate the measurement blocks.

The extended I/O measurement word facility advantageously enables the efficient obtaining of measurement data for a single operation. It eliminates the need for the program to fetch the channel measurement block both before and after an I/O operation in order to calculate the measurement data for that specific operation. Additionally, it allows the storing of data to be within a time resolution of approximately as low as one-half microsecond, depending on the capabilities of the channel subsystem.

Although various embodiments are described above, these are only examples. Additions, deletions and/or modifications to the above embodiments may be made, without departing from the spirit of aspects of the present invention. For instance, although a computing environment is described above, many different computing environments may be used. For instance, more or less logical partitions (or other zones) may be included in the environment. Further, one or more partitions can be running in different architecture modes. Further, there may be multiple central processing complexes coupled together. These are just some of the variations that can be made without departing from the spirit from the present invention. Other variations are possible. For example, a computing environment that includes a plurality of multiple channel subsystems, one or more of which include multiple images, may be provided. Also, the computing environment need not be based on the z/Architecture. Further, an environment may be provided that does not include logical partitioning and/or MCSS.

Moreover, an environment may include an emulator (e.g., software or other emulation mechanisms), in which a particular architecture or subset thereof, is emulated. In such an environment, one or more emulation functions of the emulator can implement one or more aspects of the present invention, even though a computer executing the emulator may have a different architecture than the capabilities being emulated. As one example, in emulation mode, the specific instruction or operation being emulated is decoded, and an appropriate emulation function is built to implement the individual instruction or operation.

Yet further, even though in the above embodiments, a channel path includes a control unit, this is not necessary. A channel path may not connect to a control unit or a device, such as with Ethernet channel paths or channel to channel adapters, as examples. These types of channel paths, as well as others are within the spirit of one or more aspects of the present invention.

As yet another example, although an LPAR hypervisor is given as an example, other hypervisors, such as a virtual machine hypervisor, as well as others, may be used.

Additionally, although the commands described herein have various fields, more, less or different fields may be provided. Further, the positions of the fields in the figures do not necessarily indicate the position within a control block. Other positions may be available. Similarly, although in some contexts, specific bytes or bits are described, these are only examples. Other bytes or bits may be used. Further, other sizes may be provided.

Moreover, although the measurement blocks are associated with subchannels in the examples provided herein, in other examples, the measurement blocks may be associated with other components of the I/O subsystem.

The above are only some examples of the enhancements/modifications that can be made. Others are possible without departing from the spirit of one or more aspects of the present invention.

The present invention can be included in an article of manufacture (e.g., one or more computer program products) having, for instance, computer usable media. The media has embodied therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method for obtaining I/O measurement queue data in a computer system comprising Secondary Queues wherein a secondary queue is a queue of I/O requests that a channel subsystem has begun to process, but is unable to complete because of a busy condition in an I/O configuration, the method comprising:

obtaining measurement data, the measurement data related to a plurality of Secondary Queues (logical control unit queues) of a channel subsystem, the measurement data comprising queuing statistics and measurement information for one or more channels attached to the plurality of Secondary Queues;

executing a store secondary queue measurement data instruction having a command request block, the command request block comprising information specifying a range of Secondary Queues—of the plurality of Secondary Queues;

for each secondary queue of the specified range of Secondary Queues, creating one or more extended secondary measurement blocks, the extended secondary measurement blocks comprising the measurement data;

in response to executing the store secondary queue measurement data instruction, storing the created one or more extended secondary measurement blocks at a memory address block directly specified by the store secondary queue measurement data instruction.

2. The method according to claim 1 wherein the command request block information specifying the range comprises a first queue number, a last queue number.

3. The method according to claim 1 wherein the command request block information comprises a length field, a command code, a multiple channel subsystem bit, a Multiple Image Facility (MIF) image ID, an extended I/O measurement block format, a format, a first queue number, a Channel SubSystem image IDentifier (CSSID), a last queue number and a last request.

4. The method according to claim 1, wherein each created extended secondary queue measurement block consists of any one of a queue valid indicator field, a queue out of range field, a queue count field, a queue number field, a summation of queue counts field, a summation of enqueues field, a summation of channel wait time field, a switch busy counts field, a control unit busy counts field, a success counts field, one or more control unit busy time fields, one or more initial command response time fields or one or more switch busy count summation fields.

5. The method according to claim 1 wherein each created extended secondary queue measurement block comprises a queue valid indicator field, a queue out of range field, a queue count field, a queue number field, a summation of queue counts field, a summation of enqueues field, a summation of channel wait time field, a switch busy counts field, a control unit busy counts field, a success counts field, one or more control unit busy time fields, one or more initial command response time fields and one or more switch busy count summation fields.

6. The method according to claim 1 wherein the storing the created one or more extended secondary measurement blocks step comprises the further step of storing a length field, a response code and a format at the memory address block specified by the store secondary queue measurement data instruction, the length field specifying the length of the memory address block.

7. The method according to claim 1 wherein the specified range of Secondary Queues—is defined within a channel subsystem image, the channel subsystem image specified by an effective Channel SubSystem image IDentifier.

8. The method according to claim 1 comprising the further steps of:
   determining a number of the one or more secondary queue measurement blocks stored by performing the further steps of:
   subtracting 8 bytes from size of the command response block; and
   dividing the result of the subtracting step by the size of a secondary queue measurement block.

9. The method according to claim 1 comprising the further steps of:
   in response to executing a modify subchannel instruction, storing a measurement block address of a subchannel of a channel subsystem, the measurement block address directly specifying a location in memory of a measurement block assigned to the subchannel;
   obtaining measurement data the measurement data related to the performance of the I/O operation of the subchannel, the measurement data comprising device busy time, wherein device busy time is the sum of time intervals when a subchannel is device busy during an attempt to initiate any one of a start function or a resume function at the subchannel;
   storing the obtained measurement data comprising a device busy time in the measurement block specified by the measurement block address, the measurement block comprising a device busy time field.

10. The method according to claim 1 comprising the further steps of:
    in response to executing a start subchannel instruction, starting an I/O operation process;
    obtaining I/O measurement data associated with the performance of the I/O operation process during the I/O operation process;
    saving the obtained I/O measurement data;
    generating an I/O interrupt at the completion of the I/O operation process;
    in response to executing a test subchannel instruction, storing the obtained I/O measurement data in an IRB memory location specified by the test subchannel instruction.

11. A computer program product for obtaining I/O measurement queue data in a system comprising Secondary Queues wherein a secondary queue is a queue of I/O requests that a channel subsystem has begun to process, but is unable to complete because of a busy condition in an I/O configuration, the computer program product comprising:
    a storage medium readable by a processing circuit and storing instructions for execution by the processing circuit for performing a method comprising:
    obtaining measurement data, the measurement data related to a plurality of Secondary Queues (logical control unit queues) of a channel subsystem, the measurement data comprising queuing statistics and measurement information for one or more channels attached to the plurality of Secondary Queues;
    executing a store secondary queue measurement data instruction having a command request block, the command request block comprising information specifying a range of Secondary Queues—of the plurality of Secondary Queues;
    for each secondary queue of the specified range of Secondary Queues, creating one or more extended secondary measurement blocks, the extended secondary measurement blocks comprising the measurement data;
    in response to executing the store secondary queue measurement data instruction, storing the created one or more extended secondary measurement blocks at a memory address block directly specified by the store secondary queue measurement data instruction.

12. The computer program product according to claim 11 wherein the command request block information specifying the range comprises a first queue number, a last queue number.

13. The computer program product according to claim 11 wherein the command request block information comprises a length field, a command code, a multiple channel subsystem bit, a Multiple Image Facility (MIF) image ID, an extended I/O measurement block format, a format, a first queue number, a Channel SubSystem image IDentifier (CSSID), a last queue number and a last request.

14. The computer program product according to claim 11 wherein each created extended secondary queue measurement block consists of any one of a queue valid indicator field, a queue out of range field, a queue count field, a queue number field, a summation of queue counts field, a summation of enqueues field, a summation of channel wait time field, a switch busy counts field, a control unit busy counts field, a success counts field, one or more control unit busy time fields, one or more initial command response time fields or one or more switch busy count summation fields.

15. The computer program product according to claim 11 wherein each created extended secondary queue measurement block comprises a queue valid indicator field, a queue out of range field, a queue count field, a queue number field, a summation of queue counts field, a summation of enqueues field, a summation of channel wait time field, a switch busy counts field, a control unit busy counts field, a success counts field, one or more control unit busy time fields, one or more initial command response time fields and one or more switch busy count summation fields.

16. The computer program product according to claim 11 wherein the storing the created one or more extended secondary measurement blocks step comprises the further step of storing a length field, a response code and a format at the memory address block specified by the store secondary queue measurement data instruction, the length field specifying the length of the memory address block.

17. The computer program product according to claim 11 wherein the specified range of Secondary Queues—is defined within a channel subsystem image, the channel subsystem image specified by an effective Channel SubSystem image IDentifier.

18. The computer program product according to claim 11 comprising the further steps of:
    determining a number of the one or more secondary queue measurement blocks stored by performing the further steps of:
    subtracting 8 bytes from size of the command response block; and
    dividing the result of the subtracting step by the size of a secondary queue measurement block.

19. A system for obtaining I/O measurement queue data, the system comprising Secondary Queues wherein a secondary queue is a queue of I/O requests that a channel subsystem has begun to process, but is unable to complete because of a busy condition in an I/O configuration, the system comprising:

a memory;

a computer system in communication with the memory, the computer system comprising an instruction fetching unit for fetching instructions from memory and one or more execution units for executing fetched instructions;

wherein the computer system includes instructions to execute a method comprising:

obtaining measurement data, the measurement data related to a plurality of Secondary Queues (logical control unit queues) of a channel subsystem, the measurement data comprising queuing statistics and measurement information for one or more channels attached to the plurality of Secondary Queues;

executing a store secondary queue measurement data instruction having a command request block, the command request block comprising information specifying a range of Secondary Queues of the plurality of Secondary Queues;

for each secondary queue of the specified range of Secondary Queues, creating one or more extended secondary measurement blocks, the extended secondary measurement blocks comprising the measurement data;

in response to executing the store secondary queue measurement data instruction, storing the created one or more extended secondary measurement blocks at a memory address block directly specified by the store secondary queue measurement data instruction.

20. The system according to claim 19 wherein the command request block information specifying the range comprises a first queue number, a last queue number.

21. The system according to claim 19 wherein the command request block information comprises a length field, a command code, a multiple channel subsystem bit, a Multiple Image Facility (MIF) image ID, an extended I/O measurement block format, a format, a first queue number, a Channel SubSystem image IDentifier (CSSID), a last queue number and a last request.

22. The system according to claim 19 wherein each created extended secondary queue measurement block consists of any one of a queue valid indicator field, a queue out of range field, a queue count field, a queue number field, a summation of queue counts field, a summation of enqueues field, a summation of channel wait time field, a switch busy counts field, a control unit busy counts field, a success counts field, one or more control unit busy time fields, one or more initial command response time fields or one or more switch busy count summation fields.

23. The system according to claim 19 wherein each created extended secondary queue measurement block comprises a queue valid indicator field, a queue out of range field, a queue count field, a queue number field, a summation of queue counts field, a summation of enqueues field, a summation of channel wait time field, a switch busy counts field, a control unit busy counts field, a success counts field, one or more control unit busy time fields, one or more initial command response time fields and one or more switch busy count summation fields.

24. The system according to claim 19 wherein the storing the created one or more extended secondary measurement blocks step comprises the further step of storing a length field, a response code and a format at the memory address block specified by the store secondary queue measurement data instruction, the length field specifying the length of the memory address block.

25. The system according to claim 19 wherein the specified range of Secondary Queues is defined within a channel subsystem image, the channel subsystem image specified by an effective Channel SubSystem IDentifier.

* * * * *